United States Patent [19]

Wandke

[11] Patent Number: 5,492,265
[45] Date of Patent: Feb. 20, 1996

[54] METHOD FOR SOLDERING PRINTED-CIRCUIT BOARDS UNDER LOW PRESSURE

[75] Inventor: Ernst Wandke, Geretsried, Germany

[73] Assignee: Linde AG, Hoellriegelskreuth, Germany

[21] Appl. No.: 307,633

[22] PCT Filed: Mar. 17, 1993

[86] PCT No.: PCT/EP93/00624

§ 371 Date: Dec. 20, 1994

§ 102(e) Date: Dec. 20, 1994

[87] PCT Pub. No.: WO93/19575

PCT Pub. Date: Sep. 30, 1993

[30] Foreign Application Priority Data

Mar. 20, 1992 [DE] Germany ............... 42 09 134.9
Jul. 31, 1992 [DE] Germany ............... 42 25 378.0

[51] Int. Cl.⁶ ............................. H05K 3/34; B23K 1/20
[52] U.S. Cl. .................... 228/205; 228/220; 228/221; 228/42
[58] Field of Search ................. 228/180.1, 201, 228/202, 205, 206, 219–221, 42

[56] References Cited

U.S. PATENT DOCUMENTS

| | | | |
|---|---|---|---|
| 4,921,157 | 5/1990 | Dishon et al. | 228/220 |
| 5,192,582 | 3/1993 | Liedke et al. | 228/205 |
| 5,193,739 | 3/1993 | Liedke et al. | 228/205 |
| 5,409,543 | 4/1995 | Panitz et al. | 228/205 |

*Primary Examiner*—Samuel M. Heinrich
*Attorney, Agent, or Firm*—Evenson McKeown Edwards & Lenahan

[57] ABSTRACT

The invention relates to a method for soldering electronic components to printed circuit boards or other elements to be connected by soldering, as well as suitable continuous soldering systems. The use of electronic modules, designed in the form of printed circuit boards populated with pluggable, mountable, or surface-mountable electronic components (Surface Mounted Devices, SMDs), which must be then soldered, is growing steadily. To manufacture these modules, suitably prepared printed circuit boards are populated with the corresponding components, the latter are held in place possibly with an adhesive or soldering paste in preparation for the soldering process, and finally the printed circuit boards and the components are connected together permanently and conductively by a soldering process. This soldering process is performed under low pressure and under the plasma action of a special process gas.

20 Claims, 1 Drawing Sheet

METHOD FOR SOLDERING PRINTED-CIRCUIT BOARDS UNDER LOW PRESSURE

BACKGROUND AND SUMMARY OF THE INVENTION

The present invention relates to a method for soldering electronic components to printed circuit boards or other elements to be connected together by soldering.

The use of electronic modules, designed in the form of printed circuit boards populated with pluggable, mountable, or surface-mountable electronic components (Surface Mounted Devices, SMDs), which must then be soldered, is growing steadily. To manufacture these modules, suitably prepared printed circuit boards are populated with the corresponding components, these components being held in place possibly with an adhesive or soldering paste in preparation for the soldering process, and finally the printed circuit boards and the components are connected together permanently and conductively by a soldering process. This soldering process is currently performed, firstly, in a conventional manner with wave soldering systems, in which solder is applied to corresponding areas by one or more solder waves that contact the printed circuit boards from below, thus soldering the corresponding parts. In a second manner, components mounted with soldering paste, soldering preforms or even solder deposits require only a melting of the solder component of the paste or the solder (reflow soldering).

In both cases however, flux must be used for a good quality solder connection. Either the flux is applied prior to the actual soldering process, as in the case of wave soldering, or the soldering paste or soldering preform contains both solder and flux. Flux aids the soldering process primarily by destroying the metal oxide layer on the workpiece that adversely effects soldering, and prevents oxidation of the metals involved during the soldering process. In addition, the surface tension of the liquefied solder is reduced. Fluxes are therefore multifunctional and are accordingly comprised of a number of substances. However, after the soldering process, flux residues remain on the printed circuit boards and can lead to disadvantageous consequences. These include reduction of the insulation resistance between the traces on the printed circuit board as well as premature corrosion of the traces. For this reason, the flux residue must be removed. It is known that this can be done by treating the boards with chlorofluorocarbons or chlorocarbons to clean them after the soldering process. The use of these substances, which are Known to be environmentally hazardous (the chlorofluorocarbon ozone problem) should however be minimized or completely avoided today.

In a recent process, the necessity for fluxes is at least reduced by preceding the soldering of the boards with a pretreatment of the boards with a low-pressure plasma, this plasma being generated from a process gas using microwaves and/or glow discharge. This is shown in German Patent Document 39 36 955. After this pretreatment, however, the soldering process is still performed under normal pressure and under air or only a local, limited supply of protective gas. During the pause between pretreatment and soldering it therefore happens that since oxygen is not excluded, oxide deposition and/or oxide formation can occur at the soldered locations, which has a negative influence on the soldering results. For this reason, as a rule it is not possible in this known method to completely avoid using fluxes or additives that have the same effect.

An object of the invention is therefore to provide a soldering method that permits soldering populated printed circuit boards without using flux, with a low reject rate and high quality.

This object is achieved according to the present invention by providing that the soldering process and any additional previous, intermediate, or subsequent steps are performed under low pressure and under the plasma effect of a special process gas atmosphere. There are advantages to performing previous, intermediate, and subsequent processing steps, for example heating and cooling steps, under the same low pressure as the soldering process, namely a low pressure of less than 100 mbar, preferably 0.5 to 20 mbar.

In an advantageous embodiment, during the preheating step, pretreatment of elements to be connected by soldering is achieved by a plasma effect that is generated there or penetrates, with the same process gas being used as a rule to form the atmosphere for the preheating step as is used to form the soldering atmosphere. However, it is provided in certain other advantageous embodiments for the atmosphere during the preheating step to be an atmosphere that is different from the soldering atmosphere.

In certain especially advantageous embodiments a process gas is used that acts, at least as a plasma, in both a reducing and oxidizing manner. In this way, both oxides and other impurities, for example greasy or oily residues, can be effectively removed or kept away during the processing of the workpiece.

According to certain preferred embodiments of the present invention, especially suitable mixtures are used, comprising 0.5 to 10 vol. % oxygen, 80 to 20 vol. % hydrogen, and 20 to 80 vol. % $CF_4$, $N_2$ or Ar.

As is known in theory, and also according to the invention, plasma is advantageously generated from the respective process gas mixture under the prescribed low-pressure conditions by the action of microwaves, high-frequency waves, and/or a glow discharge.

In an especially advantageous embodiment of the invention, plasma is formed in the immediate vicinity of the soldering process, in other words at the soldering location, so that soldering takes place in a particularly intensive plasma atmosphere. This measure offers considerable qualitative advantages. An especially favorable implementation of this embodiment includes, as in the case of wave soldering, wiring the soldering bath with solder waves as the cathode of a glow discharge, and so plasma formation occurs directly there.

In a majority of cases, with plasma generation at the soldering location, additional independent plasma generation at another location can be eliminated, since the effectiveness of the plasma generated at the soldering location also extends to parts of the soldering system remote from the soldering location, and in this way sufficient preparation is made for soldering.

Additional advantageous embodiments of the invention are found in the additional subclaims.

A soldering system according to the invention includes a system chamber 6 that includes the soldering station and the other stations and seals them off in a gas-tight manner from the pressure atmosphere there in the plasma state.

Other objects, advantages and novel features of the present invention will become apparent from the following detailed description of the invention when considered in conjunction with the accompanying drawings.

With different gas atmospheres in different parts of the system, gas-flow-inhibiting structures are advantageously provided between individual stations, particularly between the preheating zone and the soldering zone.

The invention will now be described in greater detail with reference to the figures.

DETAILED DESCRIPTION OF THE DRAWINGS

Figure 1:
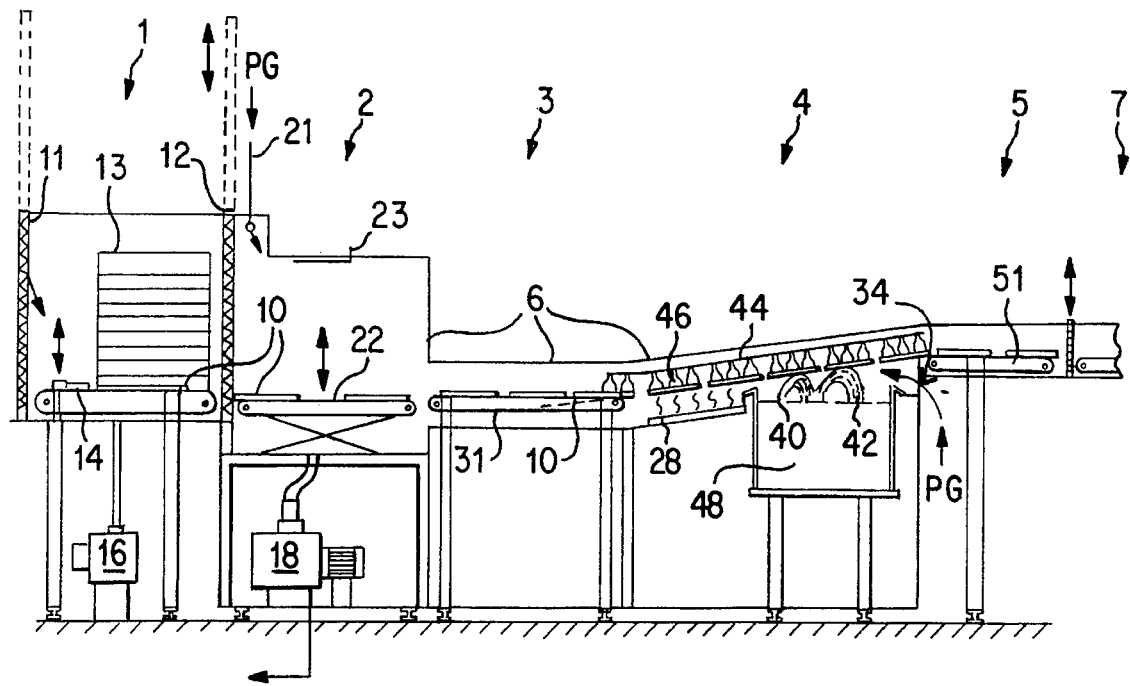
FIG. 1 is a section of a wave soldering system according to an embodiment of the present invention in a schematic side view.

FIG. 1 shows a wave-soldering system having an inlet chamber or lock 1, a system chamber 6 with entrance and pretreatment station 2, transfer station 3, wave-soldering station 4, and outlet channel 5 as well as an outlet lock 7.

The system shown operates so that initially a stacking unit filled with printed circuit boards 10 is introduced into lock 1. Lock slide 11 is initially opened and the lock chamber is therefore at ambient pressure. Using a switchable pump 16, after the lock slide 11 is closed the air is pumped out of the inlet lock 1. After a suitable time, i.e. when most of the air has been removed from the lock chamber, the chamber is flushed with process gas or an inert gas such as nitrogen. This pumping and cooling cycle can be performed several times if desired for reasons relating to atmospheric purity. Finally, the chamber is pumped down, and this pumping lasts until a pressure level in lock 1 is reached that prevails in the system chamber 6 of the soldering system, in other words in the inlet or pretreatment station 2, the transfer station 3, and the soldering station 4 with the outlet channel 5. In the present embodiment, a pressure level of approximately 1 to 2 mbar is maintained with the aid of an additional main pump 18 located below the system chamber 6 and by a suitable process gas supply PG above the chamber 60. This pressure must be produced in the inlet lock 1.

When the pressures in the inlet lock 1 and the system chamber 6 have completely equalized, an inner lock slide 12 is opened and the printed circuit boards 10 are transferred individually from the stacking unit 13 into the pretreatment station 2. This is performed by an ejecting device located in the inlet lock 1 that takes the printed circuit boards 10 out of the compartments in the stacking unit 13 and transports them to a conveyor belt 22 that is suitably adjusted both in terms of its height and its operating speed.

A first admission of process gas into the system chamber 6 takes place through a choke manifold 21, located at the top of the system chamber 6 downstream from the inner lock slide 12. In this manner, process gas is admitted with a suitable volume (this depends mainly on the pump capacity set for the main pump 18 as well as the desired system pressure) into the soldering system (in the system shown, a total of approximately 0.2 to 0.5 Nm³/h and generally as a rule between 0.1 and 2 Nm³ is added). A microwave transmitter 23 is located adjacent to the choke manifold 21 in the inlet or pretreatment station 2. The microwave transmitter 23 is used to generate the plasma from the process gas, in other words, the transmitter 23 produces a reactive gas mixture containing radicals and ions from the process gas. A microwave excitation with 100 to 1000 watts at a frequency of about 2.5 GHz is employed for this purpose. In this manner, an effective plasma is generated in the pretreatment station from a process gas that in a preferred embodiment advantageously consists of 2 to 8 vol. % oxygen, 40 to 60 vol. % hydrogen, and 30 to 55 vol. % tetrafluorohydrocarbon ($CF_4$). This plasma, obtained from the gas mixture just recited, has both an oxidizing and a reducing effect so that after it has been allowed to act for a sufficient time, greasy and oily substances as well as the metal oxide layer that is always present and interferes with the soldering process are removed from the printed circuit boards to be treated soon after entry to the system. For this to occur, a residence time of 0.5 to 3 minutes for the printed circuit boards 10 in the active area of the plasma is required as a rule. This exposure time is readily maintained in the system shown by the transport steps that take place in the inlet and pretreatment station 2.

It should also be pointed out in connection with the system shown that the printed circuit boards 10, even after leaving the pretreatment station 2 and being transferred to the transfer station 3 on the conveyor belt 31, do not completely leave the active area of the plasma, but are exposed even in the transfer area 3 to the action of the plasma produced in the pretreatment station 2. Indeed, specifically according to the invention and in contrast to known methods, the printed circuit boards 10 remain under low pressure and in the process gas as well as (in part) the plasma gas and are not exposed again to higher pressures and possibly impure atmospheres. Resumption of oxygen deposition and/or oxidation is therefore basically avoided and the favorable state of preparation of the parts for soldering is maintained.

At the end of the transfer station 3, the printed circuit boards are transferred to a freely suspended transport device 44 with support elements 46. The speeds of the conveyor belt 31 and the transport device 44 are synchronized for this purpose. The transport device 44 conveys the printed circuit boards 10 at a suitable pitch angle to the two solder waves 40 and 42 (double-wave soldering) and beyond, with the boards 10 advancing over a preheating device 28 that comprises infrared heaters. Soldering is performed by the two solder waves 40 and 42, with those areas of the printed circuit boards 10 that have been pretreated with anti-adhesives remaining unaffected by the solder. During the soldering process itself, the low-pressure conditions and the process gas atmosphere produce a readily flowing, finely wetting solder that requires no flux additive. Advantageously, an additional source or process gas 34 is provided adjacent to solder waves 40, 42.

In an advantageous embodiment of the invention, the solder bath 48 is wired with the two solder waves 40 and 42 as the cathode opposite an anode 49 provided above the transport system 44, so that a glow discharge plasma is formed directly through the solder bath in the solder waves, resulting in particular activation and an additional advantageous effect on the soldering process. In this manner, extremely high-grade soldered connections and especially low failure rates are achieved. In an alternative embodiment to the one described above, plasma formation near the solder waves is effected by a suitably located microwave or high frequency (HF) transmitter.

In many cases, for example as a rule in printed circuit boards that have not been contaminated and/or oxidized beyond normal, the above illustrated embodiment of the invention can be operated even without independent plasma formation in the entrance station 2, since the plasma generated at the location of the solder waves already sufficiently prepares the printed circuit boards on their way to the solder waves, and, on the other side, the plasma effect during the soldering process itself remains unchanged. It is true here and generally that the effects of the plasma are not limited to the immediate vicinity of where it is generated.

After passing through the soldering station 4, the printed circuit boards (now soldered) enter the cooling outlet channel 5 of the soldering system. This outlet channel 5 is provided with a conveyor 51 such that the printed circuit boards 10 are taken away from the solder station 4 and conveyed further. The outlet channel 5 leads to an outlet lock 7 with associated pushers. This lock 7 is loaded by the conveyor device 51 such that for example as soon as two printed circuit boards 10 are picked up by the transport device 44, these boards 10 are transferred by a rapid push into the outlet lock 7 when the next board 10 appears, providing the time required for a locking-out process to be performed in the lock 7. In the locking-out process, the lock 7 is flushed with either air or nitrogen for example down to ambient pressure, and then the outlet slide is opened. After emerging from the lock 7, the printed circuit boards 10 are treated as finished, since the flux-free method used allows the otherwise conventional final cleaning. The lock 7 of course must be evacuated again for the next locking-out process.

Figure 2:
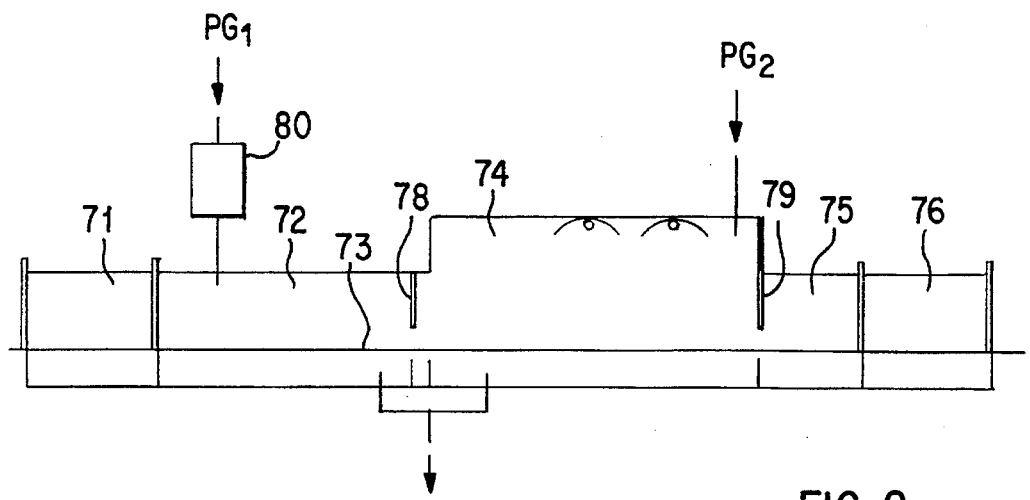
FIG. 2 is a section of a reflow solder system according to the invention, and is also shown schematically.

FIG. 2 shows a throughflow-reflow soldering system according to an embodiment of the present invention, in which the printed circuit boards are conveyed sequentially on a transport device 73 through the system. (The printed circuit boards are not shown in FIG. 2).

The system of FIG. 2 has an inlet lock 71, a preheating and possibly a pretreatment area 72, a soldering station 74, and an outlet lock 76. The pressure drop in the relevant parts of the system, in other words the preheating area 72, the soldering station 74 and a short outlet zone 75 (together these correspond to the system chamber 6 of FIG. 1), is produced by a pumping system, not shown. The printed circuit boards to be processed are fed individually or in small groups through the inlet lock 71 into the system, with locking being performed in accordance with the stack locking described above, and this is also readily possible with the available frequency (a minimum of about 10 seconds to 20 seconds). To convey the printed circuit boards, a stepwise advance using the transport device 73 is executed in synchronization, so that the printed circuit boards are conveyed from one station to the next and eventually are transported through the entire system.

From the inlet lock 71 the printed circuit boards initially go to the preheating and pretreatment station 72. Here the plasma gas is emitted and allowed to act for the first time.

In the illustrated embodiment the plasma is formed from the process gas in an external plasma-generating device 80 and then fed to the preheating and pretreatment station 72. For example, a gas mixture composed of 5% oxygen, 60% hydrogen, and 35% tetrafluorohydrocarbon ($CF_4$) is used. In addition, the printed circuit boards are preheated to about 150° C. in station 72 by suitable heating devices. Transport through, and processing in, this station 72 lasts approximately between 20 and 240 seconds. The printed circuit boards then enter the soldering zone 74. Both the pretreatment station 72 and the soldering zone 74 are at a pressure of less than 5 mbar. In the embodiment of FIG. 2, however, the soldering zone 74 does not receive an additional supply of process gas mixture as described above, but a gas mixture PG2 that contains nitrogen instead of $CF_4$ is supplied, since after the highly effective process gas from the pretreatment station 72, a soldering process containing an inert gas is sufficient, with plasma formation taking place here outside once again. Finally, soldering is triggered in the soldering zone 74 by the heat radiators mounted on the ceiling of the soldering zone 74 (T approximately 210° C.). For example, solder applied in the form of solder deposits, in other words amounts of solder that have been suitably measured and positioned on the printed circuit board, are melted, soldering the respective parts. The soldering zone 74 is separated from the pretreatment station 77 and adjacent system area 75 in the system shown, by partitions 78, 79, not in a gas-tight manner but sufficiently to prevent gas flow. In this manner, the different atmospheres in the different parts of the system can be better maintained.

In the system area 75, cooling of the printed circuit boards begins after the reflow process at the soldering station 74, so that this part of the system can have nitrogen added, for example. From system area 75 the printed circuit boards enter an outlet lock 76, where they are again completely cooled under nitrogen for example and brought to normal pressure. This completes the soldering of the printed circuit boards, with solder without flux or with only minimal amounts of flux being used for the entire soldering process. This embodiment of the method according to FIG. 2 can also be performed, in a somewhat simplified manner but sufficiently effectively as a rule, without partitions and without supplying plasma to the preheating station 72, with the preheating area then obtaining its atmosphere from soldering zone 74.

In this manner, in other words with the performance of all important method steps for soldering under low pressure and in a plasma or process gas atmosphere, a novel soldering method is provided that offers high-quality soldering performed in an environmentally conscious manner, especially of fully soldered printed circuit boards, avoiding using fluxes and consequently final cleaning treatments that release chlorofluorocarbons.

Although the invention has been described and illustrated in detail, it is to be clearly understood that the same is by way of illustration and example, and is not to be taken by way of limitation. The spirit and scope of the present invention are to be limited only by the terms of the appended claims.

I claim:

1. Method for soldering with a soldering system electronic components onto printed circuit boards using wave soldering, the method comprising the steps of:

feeding the printed circuit boards populated with the electronic components to soldering station;

soldering the electronic components to the printed circuit boards, the soldering including guiding the populated printed circuit boards with contact over at least one solder wave generated in a solder bath, so that solder is applied to the corresponding areas to be soldered in a wave soldering process, said wave soldering process being performed under low pressure and under the plasma action of a special process gas; and cooling the populated printed circuit boards after the soldering step to harden the solder.

2. Method according to claim 1, wherein the steps that precede, parallel, or follow the soldering process are carried out under the same low pressure as the soldering process itself.

3. Method according to claim 2, wherein the low pressure is less than 100 mbar.

4. Method according to claim 2, wherein the low pressure is between 0.5 to 20 mbar.

5. Method according to claim 1, wherein the preheating step includes effecting a plasma action on the electronic components and the printed circuit boards by a plasma action of the process gas produced independently therein, wherein the same said process gas forms the atmosphere for the preheating step as is used to form the soldering atmosphere.

6. Method according to claim 1, wherein the atmosphere during the preheating step is an atmosphere that differs from the atmosphere during the soldering process.

7. Method according to claim 1, wherein the process gas, at least as a plasma, has both a reducing and oxidizing effect and contains oxygen and hydrogen simultaneously.

8. Method according to claim 7, wherein the process gas is a gas mixture composed of 0.5 to 10 vol. % oxygen, 80 to 20 vol. % hydrogen, and 20 to 80 vol. % $CF_4$, $N_2$ or Ar.

9. Method according to claim 1, wherein the plasma action or the plasma from the process gas is produced by at least one of microwaves, high-frequency waves, and a glow discharge with sufficient energy.

10. Method according to claim 1, wherein the plasma is generated at the soldering location.

11. Method according to claim 9, wherein the solder bath is the cathode of a glow discharge for the wave soldering.

12. Method according to claim 1, further comprising generating the plasma outside the soldering system and supplying the plasma to the soldering system.

13. Method according to claim 12, further comprising dividing the generated plasma before supplying the plasma to the soldering system.

14. Method according to claim 1, further comprising mixing the process gas mixture at the soldering system.

15. Method according to claim 1, wherein the process gas mixture is a prepared mixture.

16. Method according to claim 1, wherein the preheating is by at least one of infrared light, microwaves, and other electromagnetic waves.

17. Method according to claim 1, wherein the preheating is accomplished by energy transfer through the plasma.

18. Method according to claim 1, comprising preheating the printed circuit boards fed to the soldering station.

19. Continuous soldering system with a soldering station and additional stations, comprising:

a system chamber containing the soldering station and the additional stations, said system chamber chamber being sealed gas-tight from the environment;

means for generating a low pressure in said system chamber; and means for forming a specific low-pressure atmosphere in said system chamber in the plasma state.

20. Soldering system according to claim 19, further comprising gas-flow-inhibiting inserts between individual stations.

* * * * *